United States Patent
Hokari

[19]

[11] Patent Number: 5,493,143
[45] Date of Patent: Feb. 20, 1996

[54] SOLID COLOR IMAGE PICKUP DEVICE

[75] Inventor: Yasuaki Hokari, Tokyo, Japan

[73] Assignee: NEC Corporation, Tokyo, Japan

[21] Appl. No.: 279,793

[22] Filed: Jul. 25, 1994

[30] Foreign Application Priority Data

Jul. 23, 1993 [JP] Japan ................... 5-202081

[51] Int. Cl.⁶ ............... H01L 27/148; H01L 29/768; H01L 31/0232
[52] U.S. Cl. ............... 257/432; 257/232; 257/233; 257/440; 257/642
[58] Field of Search ................... 257/432, 440, 257/232, 233, 642

[56] References Cited

U.S. PATENT DOCUMENTS

| 5,238,856 | 8/1993 | Tokumitsu | ............... 437/2 |
|---|---|---|---|
| 5,266,501 | 11/1993 | Imni | ............... 437/2 |
| 5,306,906 | 4/1994 | Aoki et al. | ............... 257/432 |

FOREIGN PATENT DOCUMENTS

| 0124025 | 11/1984 | European Pat. Off. | ............... 257/440 |
|---|---|---|---|
| 2-26071 | 1/1990 | Japan | ............... 257/432 |
| 3-190169 | 8/1991 | Japan | ............... 257/432 |
| 2251721 | 7/1992 | United Kingdom | ............... 257/432 |

*Primary Examiner*—Ngân V. Ngô
*Attorney, Agent, or Firm*—Sughrue, Mion, Zinn, Macpeak & Seas

[57] ABSTRACT

In a color CCD camera, a distance between a micro lens and a photodiode is determined dependent on a color light among red, green and blue. Alternative to this structure, a curvature of a micro lens is determined dependent on a color light among red, green and blue. In accordance with this structure, high sensitivity is obtained with improved color balance.

1 Claim, 9 Drawing Sheets

FIG.8C FOR BLUE COLOR LIGHT

FIG.8B FOR RED COLOR LIGHT

FIG.8A FOR GREEN COLOR LIGHT

FIG. 10E

SOLID COLOR IMAGE PICKUP DEVICE

FIELD OF THE INVENTION

The invention relates to a solid color image pickup device using a CCD (charge coupled device) device, and more particularly to, a CCD device having an improved light utilizing efficiency.

BACKGROUND OF THE INVENTION

A conventional color camera using CCD devices is described in the Japanese Patent Kokai No. 60-263458. In this conventional color camera, each of the CCD devices comprises a photodiode, a CCD channel, a light shielding layer for supplying an input light not to the CCD channel, but to the photodiode, and a micro lens for focusing the input light on the photodiode. Such CCD devices are provided for red, green and blue color lights on a semiconductor substrate.

In operation, each color input light is supplied to a corresponding photodiode, in which electric charges are accumulated. Then, the accumulated electric charges are transferred to the CCD channel by applying a pulse to an electrode which is provided on the CCD channel. Thus, an output signal is obtained for each of the red, green and blue input color lights.

In the conventional color camera, however, there is a disadvantage in that a high sensitivity is difficult to be obtained in all of the three primary colors, because signal output levels for the red and blue color lights are lower than that for the green color light under the condition of a large aperture of a lens diaphragm, for instance, when a curvature of the micro lens and a thickness of a resin film provided between the micro lens and the photodiode are optimized for the green color light having a wavelength shorter than that of the blue color light and longer than that of the red color light. The detailed explanation on this disadvantage will be made immediately prior to the description of the preferred embodiments.

SUMMARY OF THE INVENTION

Accordingly, it is an object of the invention to provide a solid color image pickup device in which a high sensitivity is obtained for each of the three primary colors.

It is another object of the invention to provide a solid color image pickup device in which output signals for red and blue color lights are not lowered as compared to that for a green color light, when an aperture of a lens diaphragm is made large.

According to the first feature of the invention, a solid color image pickup device, comprises:

first to third CCD devices for receiving first to third color lights of first to third wavelengths to generate first to third output signals;

each of the first to third CCD devices, comprising:

an optoelectric conversion region provided on a semiconductor substrate, the optoelectric conversion region being supplied with a corresponding one of the first to third color lights to generate a corresponding one of the first to third output signals;

a resin layer for covering the optoelectric conversion region; and a micro lens for focusing the corresponding one of the first to third color lights on the optoelectric conversion region;

wherein the resin layer has a predetermined thickness inherent to the corresponding one of the first to third color lights.

According to the second feature of the invention, a solid color image pickup device, comprises:

first to third CCD devices for receiving first to third color lights of first to third wavelengths to generate first to third output signals;

each of the first to third CCD devices, comprising:

an optoelectric conversion region provided on a semiconductor substrate, the optoelectric conversion region being supplied with a corresponding one of the first to third color lights to generate a corresponding one of the first to third output signals;

a resin layer for covering the optoelectric conversion region; and a micro lens for focusing the corresponding one of the first to third color lights on the optoelectric conversion region;

wherein the micro lens has a predetermined curvature inherent to the corresponding one of the first to third color lights.

According to the third feature of the invention, a solid color image pickup device, comprises:

first to third CCD devices for receiving a white color light to generate first to third output signals corresponding to first to third color lights of first to third wavelengths, the first to third CCD devices being provided on a semiconductor substrate;

each of the first to third CCD devices, comprising:

an optoelectric conversion region provided on the semiconductor substrate, the optoelectric conversion region being supplied with a corresponding one of the first to third color lights to generate a corresponding one of the first to third output signals;

a resin layer for covering the optoelectric conversion region; and a color filter for selecting the corresponding one of the first to third color lights from the white color light; and a micro lens for focusing the corresponding one of the first to third color lights on the optoelectric conversion region;

wherein the micro lens has a predetermined curvature to the corresponding one of the first to third color lights.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
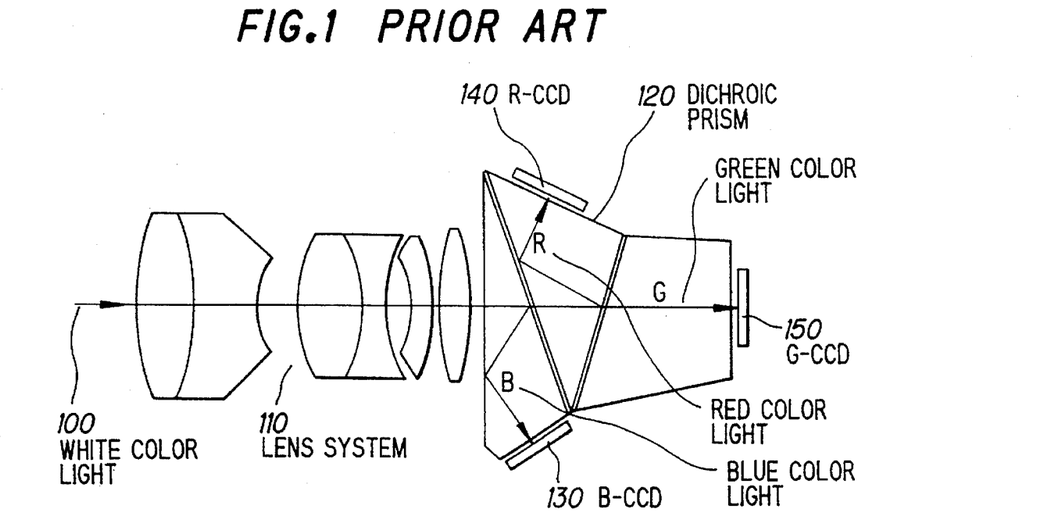
FIG. 1 is an explanatory view showing a conventional CCD color camera.

Before describing a solid color image pickup device (defined "CCD device" hereinafter) in the preferred embodiments according to the invention, a conventional color camera using three CCD devices will be explained in FIG. 1.

The conventional color camera comprises a lens system 110 for focusing an input white color light 100 on predetermined points, a dichroic prism 120 for dividing the white color light into red, green and blue color lights R, G and B, and R, G and B-CCD devices 140, 150 and 130 positioned at the predetermined points for converting the red, green and blue color lights R, G and B to red, green and blue electric signals.

In this conventional color camera, a white color light 100 from a subject to be taken in an image is propagated through the lens system 110, and divided into the three primary color lights R, G and B by the dichroic prism 120. The divided primary color lights R, G and B are focused on the R, G and B-CCD devices 140, 150 and 130, from which R, G and B image signals are obtained.

Figure 2:
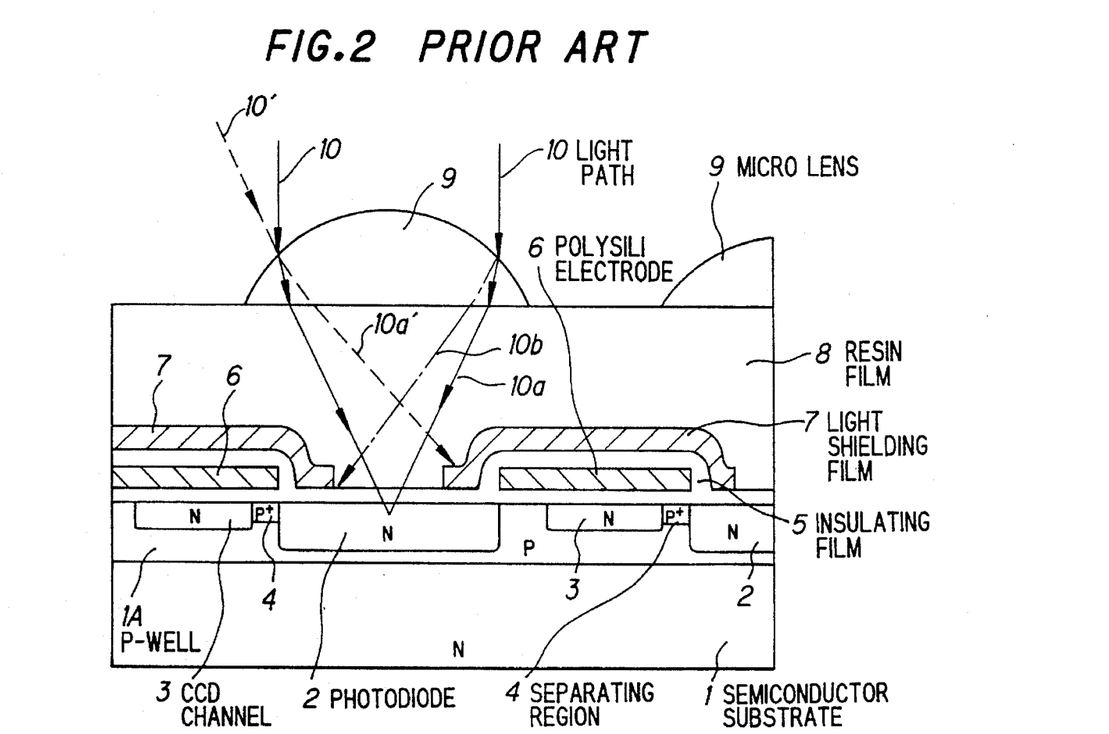
FIG. 2 is a cross-sectional view showing a conventional CCD device.
Figure 3:
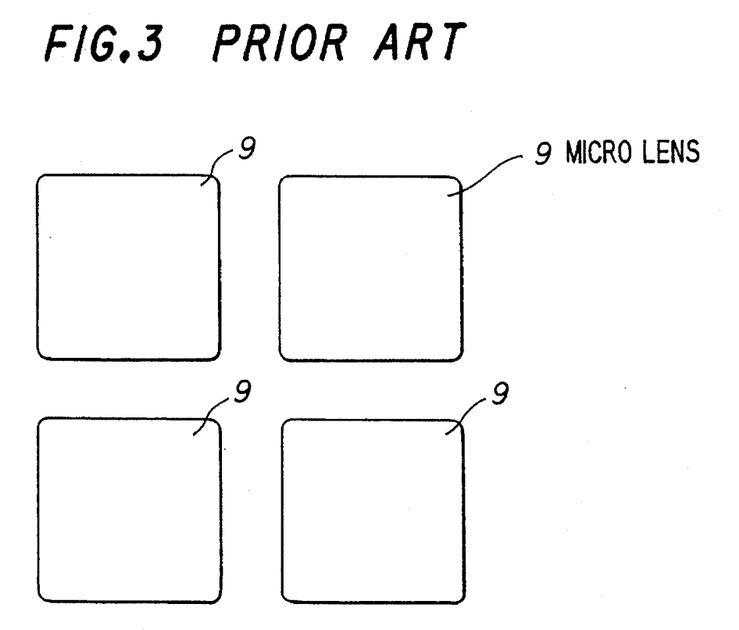
FIG. 3 is a plan view showing the arrangement of micro lenses.

FIG. 2 shows a conventional CCD device which comprises a N-semiconductor substrate 1, a P-well 1A, a N-impurity region for providing a photodiode 2 to carry out optoelectric conversion, a N-impurity region for providing a CCD channel 3 to transfer electric charges, a P$^+$-separating region 4 for separating the photodiode 2 and the CCD channel 3, an insulating film 5 formed on the respective regions, a polysilicon electrode 6 applied with a pulse to transfer electric charges accumulated in the photodiode 2 to the CCD channel 3, a light shielding film 7 for shielding a light supplied to the CCD channel 3, a resin film 8 for adjusting a focus length, and a micro lens 9 (also shown in FIG. 3) for focusing a light on the photodiode 3.

In this conventional CCD device, a light 10 focused by the micro lens 9 is propagated through the resin film 8 to be focused on the photodiode 2 via an aperture of the light shielding film 7, so that the optoelectric conversion is effected in the photodiode 2 in which electric charges are accumulated. The accumulated electric charges are transferred to the CCD channel 3 by applying a pulse to the electrode 6, and the electric charges thus transferred are transferred in a direction orthogonal to the paper plane of FIG. 2 via the CCD channel.

In this operation, a light utilizing efficiency is determined by a ratio of a light introduced into the photodiode 2 relative to a light supplied to the micro lens 9. In order to enhance the light utilizing efficiency, a curvature of the micro lens 9 and a thickness of the resin film 8 are optimized to focus a light 10a on the surface of the photodiode 2 or an interval point of 0.1 to 0.2 μm below the surface of the photodiode 2.

Figure 4:
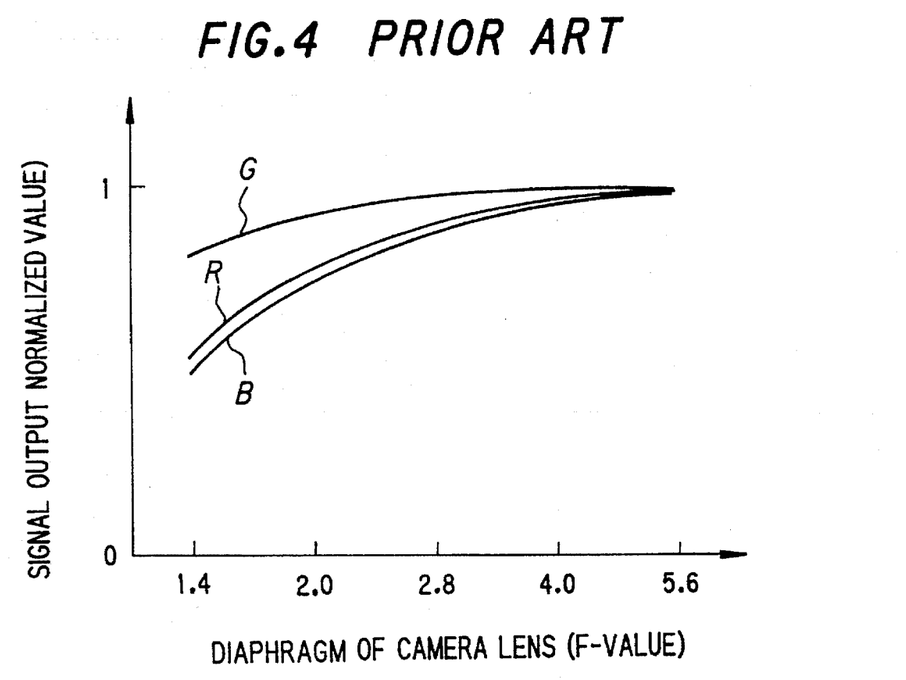
FIG. 4 is a graph showing the collapse of color balance in the conventional color CCD device.

FIG. 4 shows an signal output level of the CCD device relative to an aperture (F-value) of a lens diaphragm, wherein the F-value is small as the aperture of the lens diaphragm is large. As shown therein, when the aperture becomes large to increase an input light amount, the signal output level is inverse-proportionally decreased. This means that a signal output is not obtained in proportional to an input light amount, although some difference is observed among the red, green and blue color lights R, G and B, wherein the decreased amount is significant for the red and blue color lights R and B.

Referring again to FIG. 2, when the aperture of the lens diaphragm is made small, an input light is vertical to the photodiode 2 as shown by the light 10a. On the other hand, when the aperture of the diaphragm is made large, an input light is slant to the photodiode 2 as shown by the light 10', so that the light 10' is focused a little above the surface of the photodiode 2 as shown by the light 10'a, some of which is shielded by the light shielding film 7, thereby decreasing the amount of signal electric charges.

In case where the micro lens 9 and the resin film are optimized for a green color light having a high visual sensitivity, a blue color light having a wavelength shorter than the green color light has a focus point above the photodiode 2, and, when the aperture of the lens diaphragm is made large, the focus point of the blue color light is shifted to an upper position. This means that a light utilizing efficiency of the blue color light is lowered due to the shield of an input light as compared to that of the green color light. On the contrary, although a red color light is focused below the photodiode 2, the increase in amount of an input light which is shielded by the light shielding film 7 is similarly observed to the case for the blue color light. This is the reason why the signal output levels of the red and blue color lights R and B are decreased to be much lower than that of the green color light G, as shown in FIG. 4, when the aperture of the lens diaphragm is made large, that is, the F-value is made small. This phenomenon is remarkable, when an aperture of the micro lens 9 is large to enhance a sensitivity of a color camera. For this reason, a high sensitivity of a color camera is limited practically.

Next, CCD devices in the first preferred embodiment according to the invention will be explained in FIGS. 5A to 5C, wherein like parts are indicated by like reference numerals as used in FIG. 2, and the resin layers 8 are replaced by a resin layer 8G for a green color light, a resin layer 8R for a red color light, and a resin layer 8B for a blue color light.

In the first preferred embodiment, a thickness of the resin layer 8G for the green color light is 6 μm, while those of the resin layers 8R and 8B for the red and blue color lights are 6.2 μm and 5.8 μm, respectively.

Figures 5A, 5B:
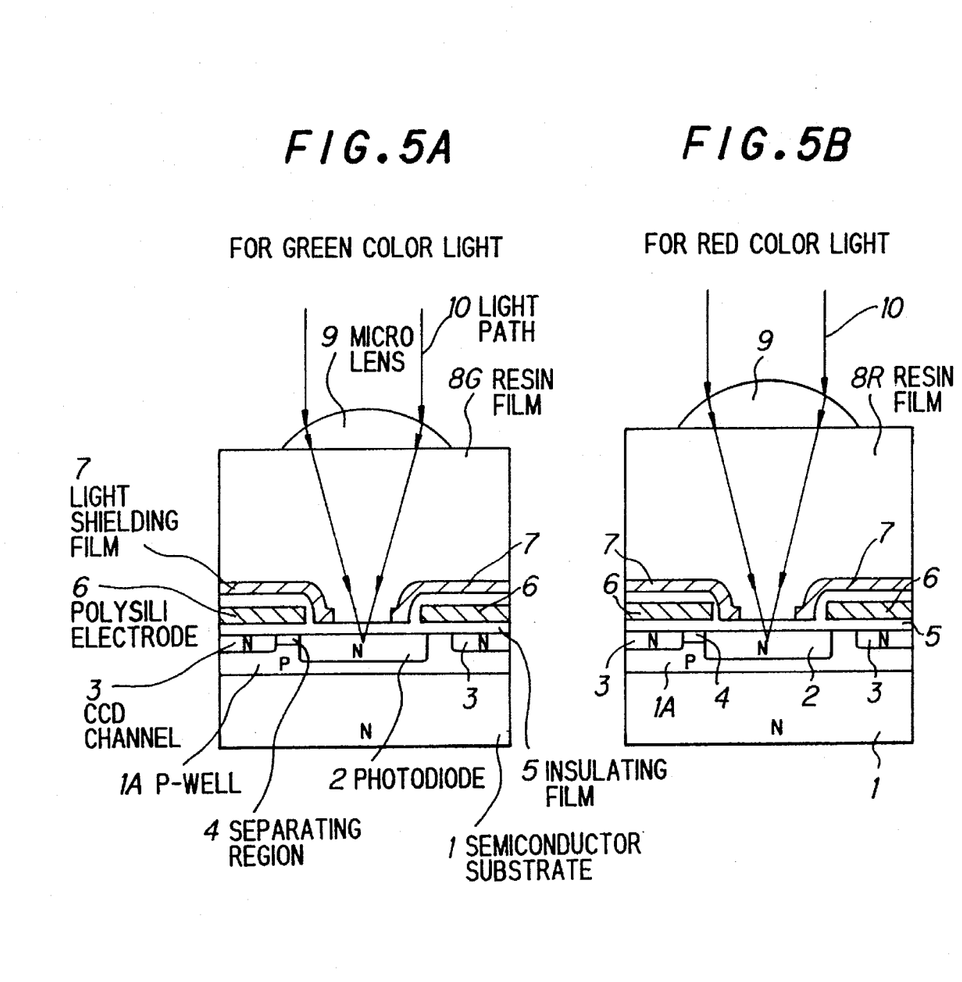
FIGS. 5A to 5C are cross-sectional views showing CCD devices in the first preferred embodiment according to the invention.
Figure 5C:
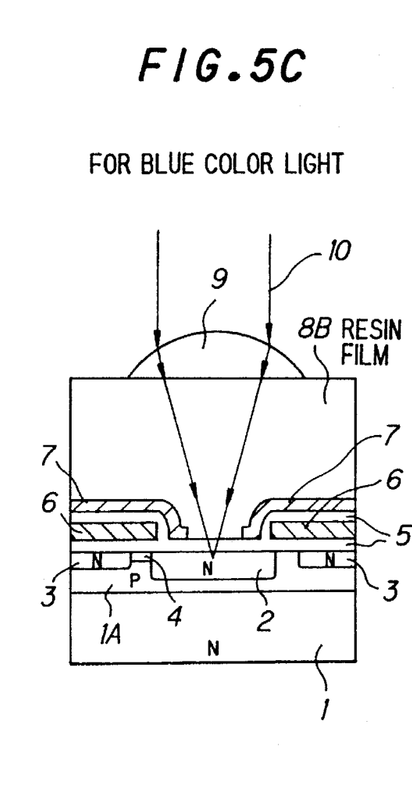

In operation, the green, red, and blue color lights are focused to be propagated through the resin layers 8G, 8R and 8B on the surfaces of the photodiodes 2 or internal points of 0.1 to 0.2 μm below the surfaces of the photodiodes 2, respectively, as shown in FIGS. 5A to 5C.

Figure 6A:
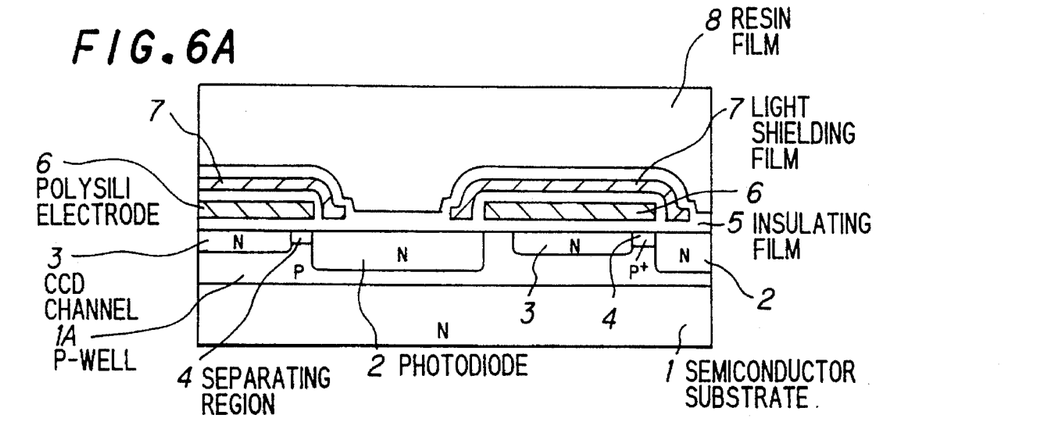
FIGS. 6A to 6C are cross-sectional views showing the steps of fabricating the CCD device in the first preferred embodiment.
Figure 6B:
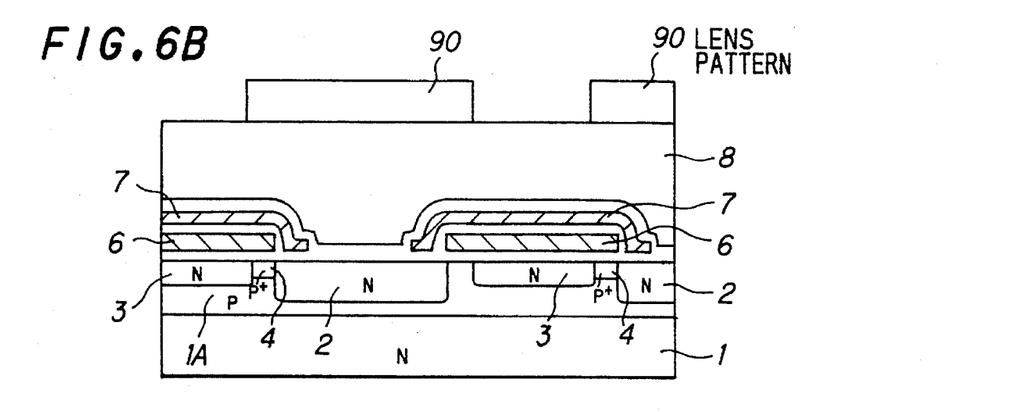
Figure 6C:
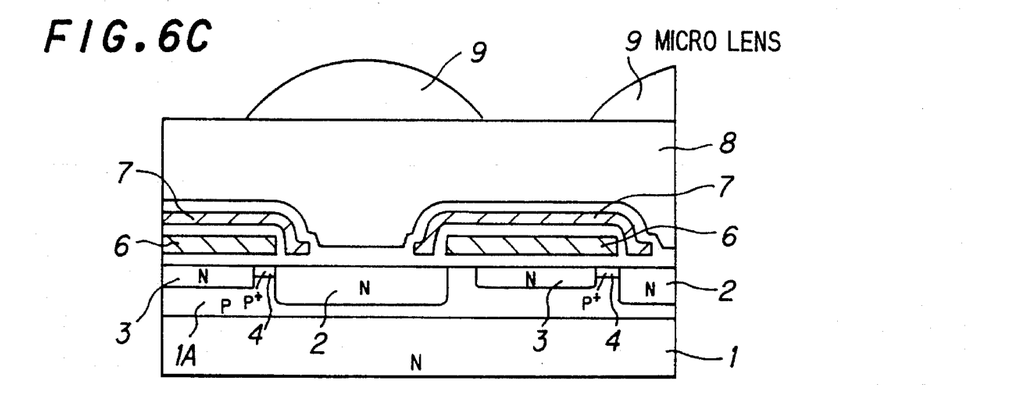

The CCD devices in the first preferred embodiment will be fabricated by the steps as shown in FIGS. 6a to 6C, wherein like parts are indicated by like reference numerals as used in FIG. 2 and FIGS. 5A to 5C.

In FIG. 6A, a resin film 8 (one of the resin layers 8R, 8G and 8B) having a sufficiently high light transmission factor is formed to be a predetermined thickness by coating, for instance, photo-resist layers a number of times and baking the coated layers to be solidified at a temperature of 170° C. to 200° C.

In FIG. 6B, a photo-resist layer is coated on the resin film 8 to provide a lens pattern 90.

In FIG. 6C, the lens pattern 90 is heated to be fluidized at a temperature of 160° to 180° C., so that micro lenses 9 are formed with a predetermined curvature in accordance with the surface tension of the fluidized lens pattern. The curvature of the micro lenses 9 is mainly determined by a thickness and a diameter of respective lens elements in the lens pattern 90, although it is slightly affected by the baking temperature.

As understood from the above steps, an input light can be focused on the surface of the photodiode 2 or an internal point of 0.1 to 0.2 μm below the surface of the photodiode 2 by appropriately selecting a thickness of the resin layer 8 and a thickness and a diameter of the lens element in the lens pattern 90.

Figure 7:
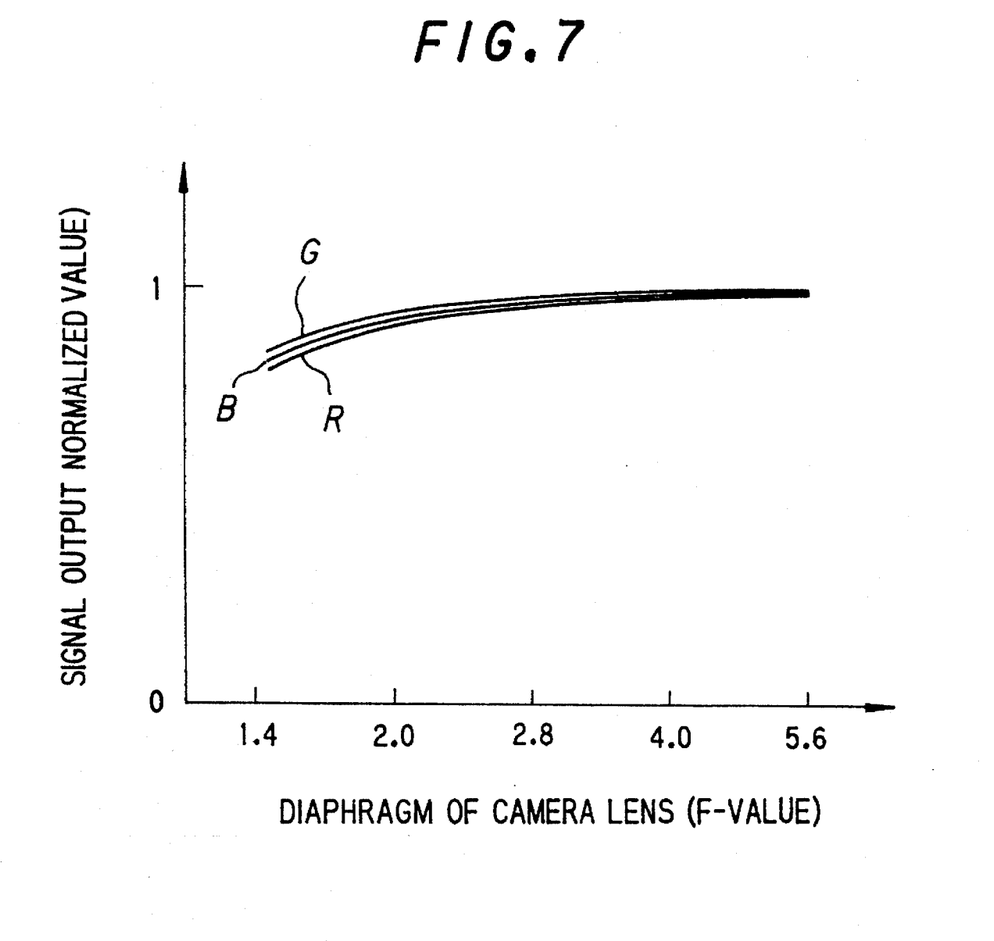
FIG. 7 is a graph showing the color balance in signal outputs in the CCD device in the first preferred embodiment.

FIG. 7 shows that the deterioration of sensitivities for the red, green and blue color lights R, G and B is minimized in the CCD devices in the first preferred embodiment, even if an F-value is made small by enlarging an aperture of a lens diaphragm, and that signal output characteristics are equalized for the red, green and blue color lights R, G and B to avoid the deviation among the respective color lights and keep the color balance thereamong.

Figure 8A:
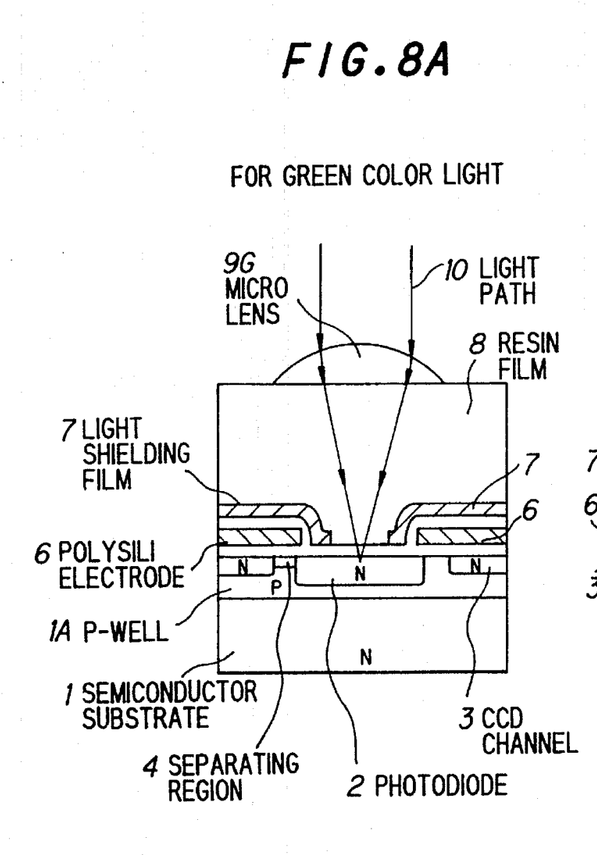
FIGS. 8A to 8C are cross-sectional views showing CCD devices in the second preferred embodiment according to the invention.
Figure 8B:
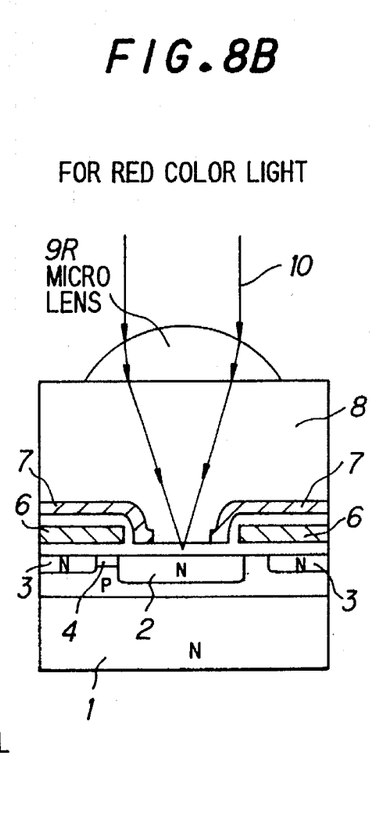
Figure 8C:
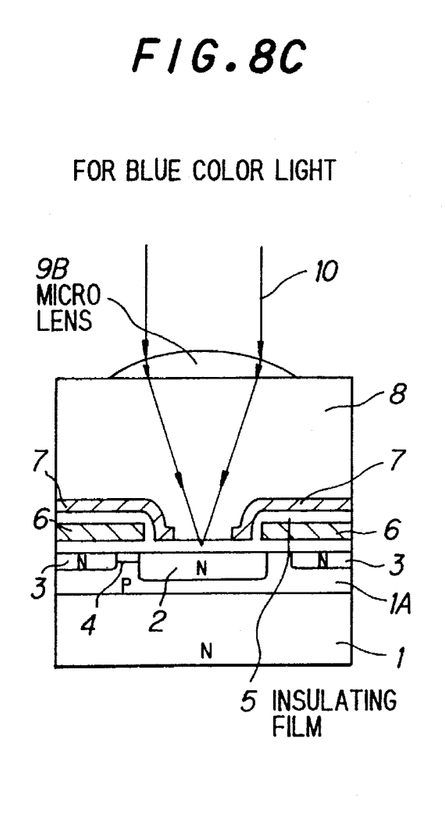

FIGS. 8A to 8C show CCD devices in the second preferred embodiment according to the invention, wherein like parts are indicated by like reference numerals as used in FIG. 2, FIGS. 5A to 5C, and FIGS. 6A to 6C, and the micro lenses 9 are replaced by a micro lens 9G for a green color light, a micro lens 9R for a red color light, and a micro lens 9B for a blue color light.

In the second preferred embodiment, a curvature of the micro lens 9R for the red color light is smaller than that of the micro lens 9G for the green color light, and that of the micro lens 9B for the blue color light is larger than that of the micro lens 9G for the green color light, while the resin layers 8 are the same in thickness as each other in the three primary colors.

In fabrication, the thickness of the lens patterns 90 as shown in FIG. 6B are 1.4 μm for the green color light, 1.5 μm for the red color light, and 1.3 μm for the blue color light, while the lens patterns 90 are the same in configuration for the red, green dan blue color lights. Under this condition, the same steps for the first preferred embodiment are carried out for the second preferred embodiment.

Figure 9:
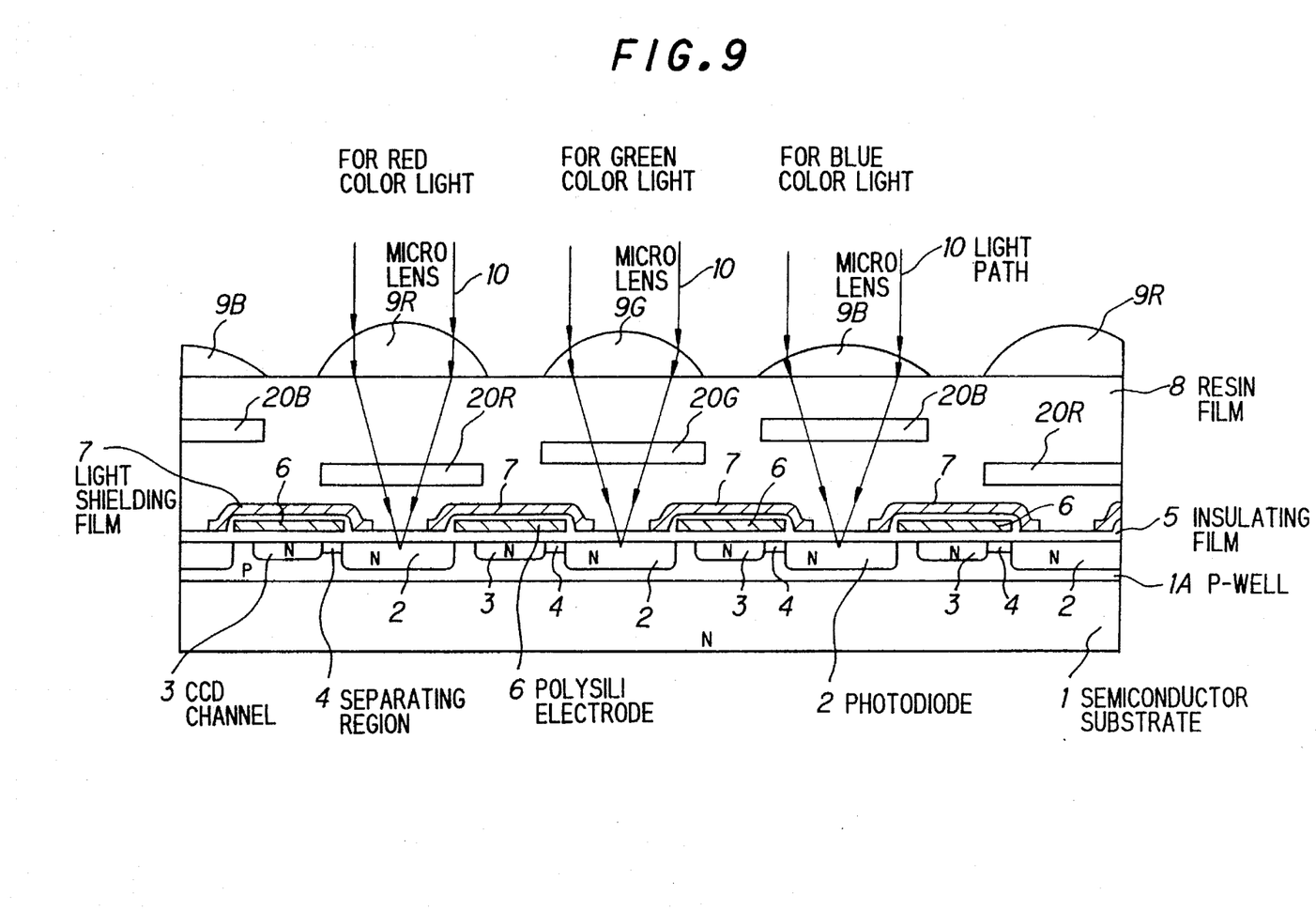
FIG. 9 is a cross-sectional view showing CCD devices in the third preferred embodiment according to the invention.

FIG. 9 shows CCD devices provided on a common semiconductor substrate in the third preferred embodiment.

FIG. 9 shows CCD devices provided on a common semiconductor substrate in the third preferred embodiment according to the invention, wherein like parts are indicated by like reference numerals as used in FIG. 2, FIGS. 5A to 5C, FIGS. 6A to 6C, and FIGS. 8A to 8C.

In the third preferred embodiment, a curvature of the micro lens 9R for the red color light is smaller than that of the micro lens 9G for the green color light, and that of the micro lens 9B for the blue color light is larger than that of the micro lens 9G for the green color light. In addition, a red color filter 20R, a green color filter 20G and a blue color filter 20B are provided on th photodiodes 2 of the red, green and blue color lights, respectively.

In operation, a white color light 10 is supplied to the CCD devices, so that a red color light, a green color light and a blue color light are supplied from the red color filter 20R, the green color filter 20G and the blue color filter 20B to the corresponding photodiodes 2, respectively. Consequently, red, green and blue output signals are obtained at the corresponding CCD channels 3.

The CCD devices in the third preferred embodiment will be fabricated by the steps as shown in FIGS. 10A to 10E.

Figure 10A:
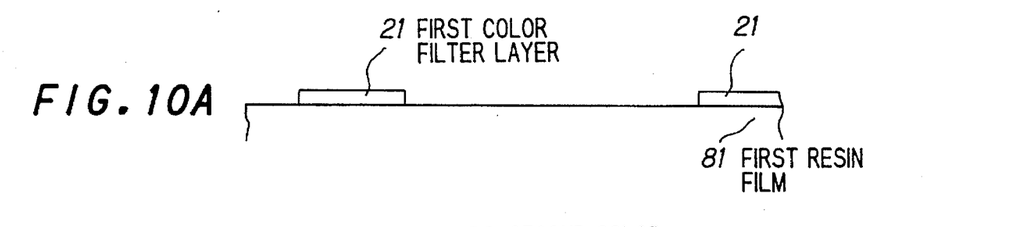
FIGS. 10A to 10E are cross-sectional views showing the steps of the CCD devices in the third preferred embodiment.

In FIG. 10A, a first resin film 81 is coated and baked to be solidified, and a first color filter layer 21 is coated on the first resin film 81. Then, the first color filter layer 21 is etched to be removed on unnecessary regions.

The sufficiently transparent resin materials under the visible light of 400 nm to 800 nm wavelength are required for the resin film 81. The suitable materials are PGMA and PMMA photoresists. For the first color filter layer 21, one suitable material is a proteinaceous-type photoresist, such as gelatin and casein. This type of photoresist is dyed by dyecrete process after the filter layer patterning. Another possible material is the photoresists with pigment in the material.

Figure 10B:
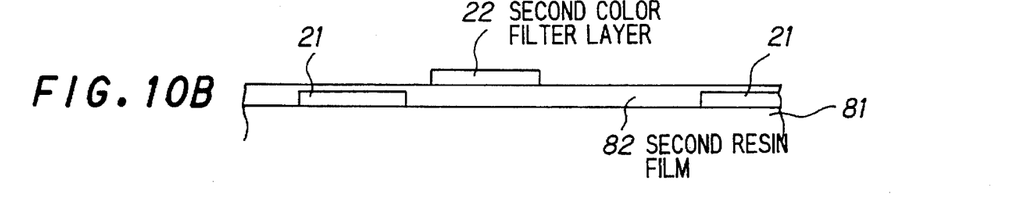

In FIG. 10B, a second resin film 82 is coated and baked to be solidified, and a second color filter layer 22 is coated on the second resin film 82. Then, the second color filter layer 22 is etched to be removed on unnecessary regions.

Figure 10C:
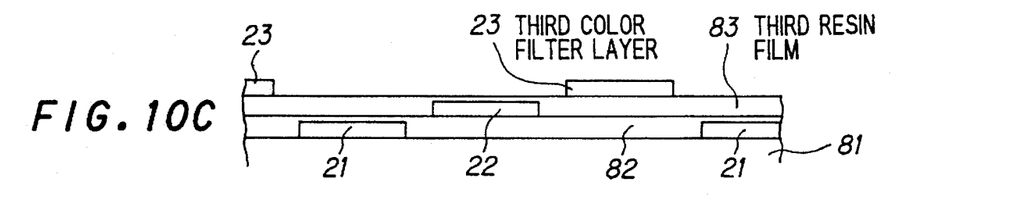

In FIG. 10C, a third resin film 83 is coated and baked to be solidified, and a third color filter layer 23 is coated on the third resin film 83. Then, the third color filter layer 23 is etched to be removed on unnecessary regions. Thus, the first to third color filters 21 to 23 presumably corresponding to red, green and blue color filters 20R, 20G and 20B are obtained.

Figure 10D:
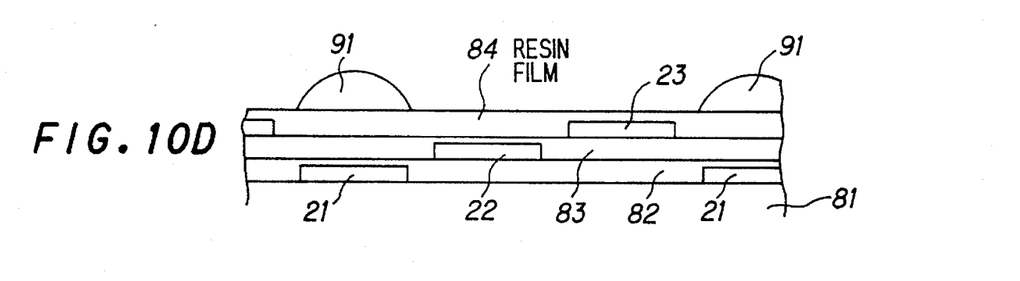

In FIG. 10D, a resin film 84 is coated and baked to be solidified, and a photoresist layer is coated on the resin film 84. Then, the photoresist layer is etched to provide a lens pattern which is thermally treated at a temperature of 170° to 200° C. Thus, the lens pattern is fluidized to be a first or red micro lens 91 which is provided on a first or red color region.

A novolac resin type photoresist is a possible candidate for micro lens materials.

Figure 10E:
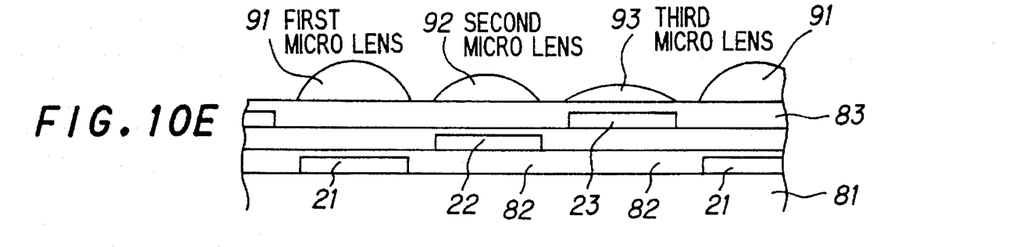

In FIG. 10E, a second or green micro lens 92 and a third or blue micro lens 93 are provided in the same manner in the first or red micro lens 91 on a second or green color region and a third or blue color region. The first or red micro lens 91 is not deformed at the time of providing the second or green micro lens 92, because the first or red micro lens 91 is hardened or cured at the thermal treatment. The second or green micro lens 92 is also not deformed for the same reason.

Figure 11:
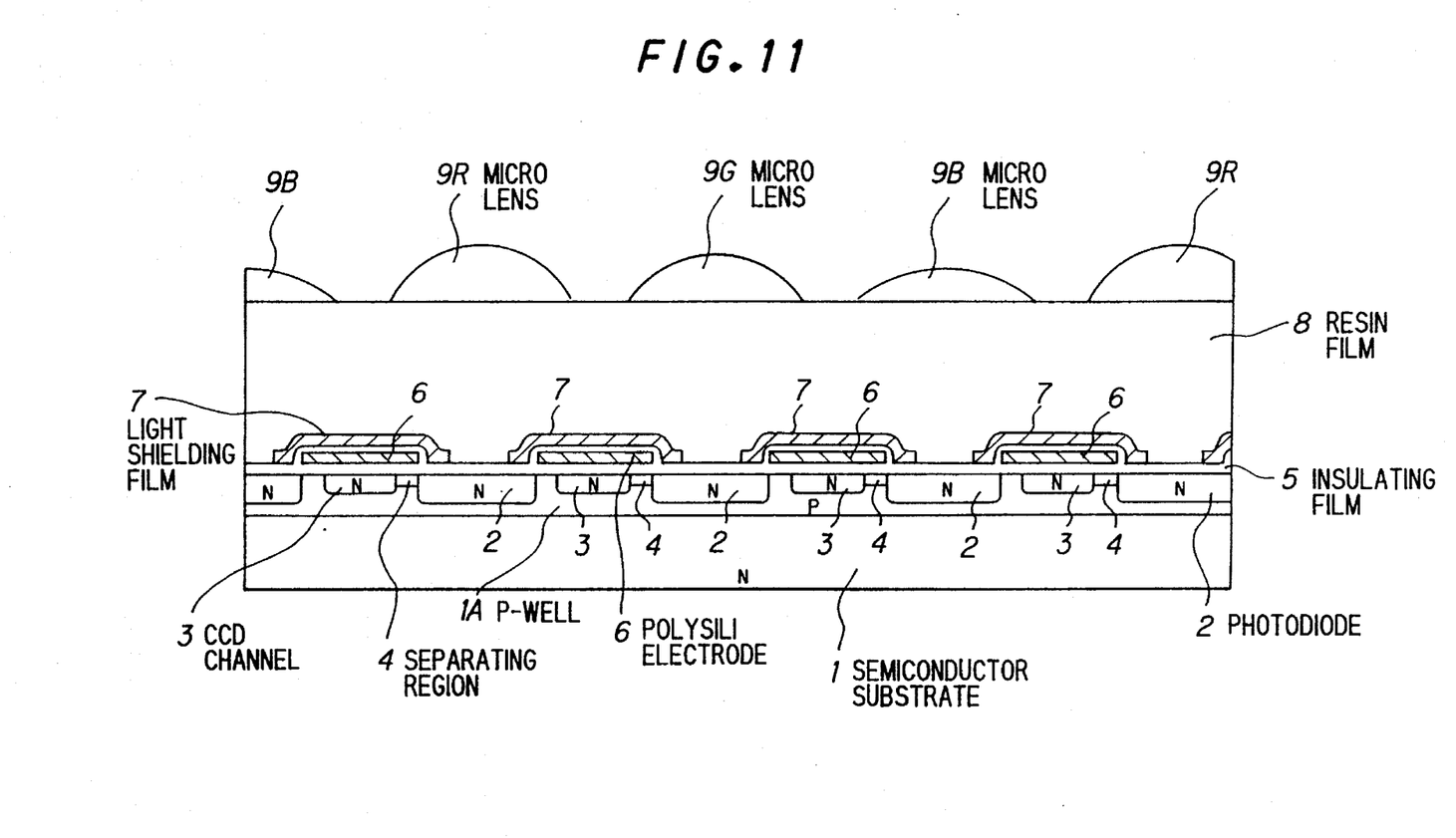
FIG. 11 is a cross-sectional view showing CCD devices in the fourth preferred embodiment according to the invention.

FIG. 11 shows CCD devices in the fourth preferred embodiment according to the invention, wherein like parts are indicated by like reference numerals as used in FIG. 2, FIGS. 5A to 5C, FIGS. 6A to 6C, FIGS. 8A to 8C, and FIG. 9.

In the fourth preferred embodiment, no color filter is used, and micro lenses 9R, 9G and 9B having different curvatures for red, green and blue color lights are formed of materials having color filter effect for the red, green and blue color lights.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A solid color image pickup device, comprising:

first to third CCD devices for receiving first to third color lights of first to third wavelengths to generate first to third output signals;

each of said first to third CCD devices comprising:

an optoelectric conversion region provided on a semiconductor substrate, said optoelectric conversion region being supplied with a corresponding one of said first to third color lights to generate a corresponding one of said first to third output signals;

a resin layer for covering said optoelectric conversion region; and a micro lens for focusing said corresponding one of said first to third color lights on said optoelectric conversion region;

said resin layer having a predetermined thickness inherent to said corresponding one of said first to third color lights;

said first, second and third CCD devices receiving red, green and blue color lights, respectively, for said first, second and third color lights;

said predetermined thickness of said resin layer for said first CCD device being greater than that of said resin layer for said second CCD device;

and said predetermined thickness of said resin layer for said third CCD device being less than that of said resin layer for said second CCD device.

* * * * *